United States Patent [19]

Harnden, Jr. et al.

[11] E Patent Number: Re. 33,577

[45] Reissued Date of Patent: Apr. 23, 1991

[54] ADVANCED PIEZOCERAMIC POWER SWITCHING DEVICES EMPLOYING PROTECTIVE GASTIGHT ENCLOSURE AND METHOD OF MANUFACTURE

[75] Inventors: John D. Harnden, Jr., Schenectady; William P. Kornrumpf, Albany; George A. Farrall, Rexford, all of N.Y.

[73] Assignee: General Electric Company, Fort Wayne, Ind.

[21] Appl. No.: 383,315

[22] Filed: Jul. 20, 1989

Related U.S. Patent Documents

Reissue of:

[64] Patent No.: 4,689,517
Issued: Aug. 25, 1987
Appl. No.: 881,525
Filed: Jun. 30, 1986

U.S. Applications:

[62] Division of Ser. No. 685,108, Dec. 21, 1984, Pat. No. 4,714,847.

[51] Int. Cl.[5] ..... H01L 41/08
[52] U.S. Cl. ..... 310/332
[58] Field of Search ..... 310/330–332, 310/340, 344, 357–359, 367, 368; 200/181

[56] References Cited

U.S. PATENT DOCUMENTS

| | | | |
|---|---|---|---|
| 2,166,763 | 7/1939 | Mason | 310/330 |
| 2,471,967 | 5/1949 | Mason | 310/330 |
| 2,479,926 | 8/1949 | Gravley | 310/330 |
| 2,633,543 | 3/1953 | Howatt | 310/330 |
| 2,714,642 | 8/1955 | Kinsley | 310/330 |
| 3,500,451 | 3/1970 | Yando | 310/330 |
| 3,622,815 | 11/1971 | Schafft | 310/330 |
| 4,093,883 | 6/1978 | Yamamoto | 310/330 |
| 4,392,074 | 7/1983 | Kleinschmidt et al. | 310/330 |
| 4,443,729 | 4/1984 | Rider | 310/330 |
| 4,538,087 | 8/1985 | Germano et al. | 310/330 |
| 4,553,061 | 11/1985 | Germano | 310/330 |
| 4,654,555 | 3/1987 | Ohba et al. . | |

FOREIGN PATENT DOCUMENTS

| | | | |
|---|---|---|---|
| 273157 | 7/1964 | Australia . | |
| 970817 | 7/1975 | Canada . | |
| 69545 | 6/1975 | Japan . | |
| 32456 | 7/1982 | Japan . | |
| 421067 | 8/1974 | U.S.S.R. | 200/181 |
| 961606 | 6/1964 | United Kingdom . | |

OTHER PUBLICATIONS

*Electronic Engineering*, by P. Kleinschmidt, "A Piezoelectric Ceramic Touch-Operated Button", Aug. 1975, pp. 9 and 11.

Guntersdorfer, M. et al., "Application of Piezoceramics in Relays", *Electrocomponent Science and Technology*, vol. 3, 1976, pp. 1–11.

*Primary Examiner*—Mark O. Budd

*Attorney, Agent, or Firm*—Ralph E. Krisher, Jr.

[57] ABSTRACT

This application described a number of novel advanced piezoelectric ceramic power switching devices which are mounted within protective gastight enclosures that are either evacuated to a high degree of vacuum or filled with an inert gas protective atmosphere. The devices thus constructed are capable of operating over a range of load voltages extending from about 100 volts to 5000 volts or more with corresponding currents of from a few amperes to hundreds of amperes and wherein it is possible to provide a number of such structures in a single common protective gastight enclosure. For certain circuit applications the devices thus constructed have unpoled portions on which are mounted either passive circuit components such as resistors, capacitors and the like or active semiconductor devices all interconnected in circuit relationship with each other and the switching devices by using printed circuit or integrated circuit fabrication techniques. In these devices, stray circuit impedances whether capacitive, inductive or resistive in nature can be reduced to an absolute minimum by appropriate designs. Such complementary circuit components and active semiconductor devices can be, if desired, mounted within the common protective enclosures in close proximity to the piezoceramic switching devices to which they are connected, or alternatively may be mounted exteriorly of the protective enclosures.

28 Claims, 4 Drawing Sheets

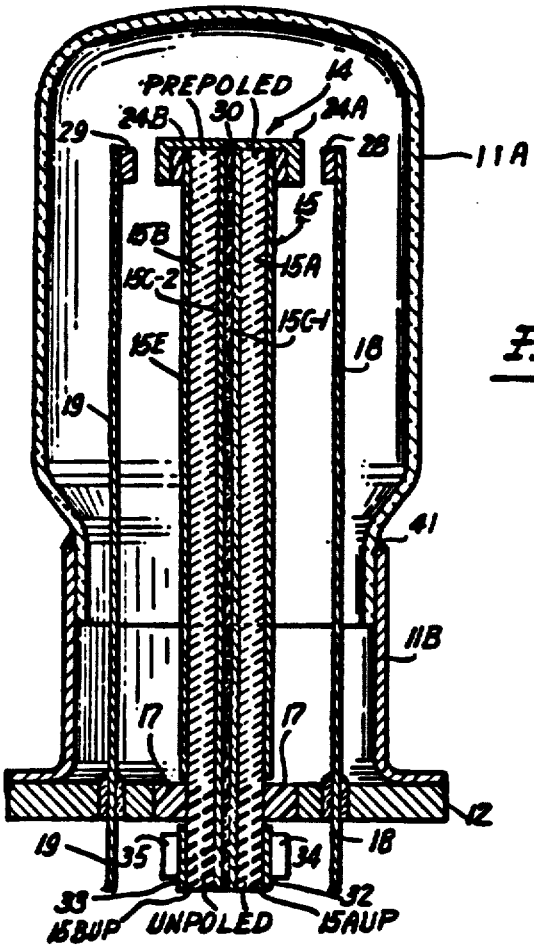
Fig. 8
Fig. 9
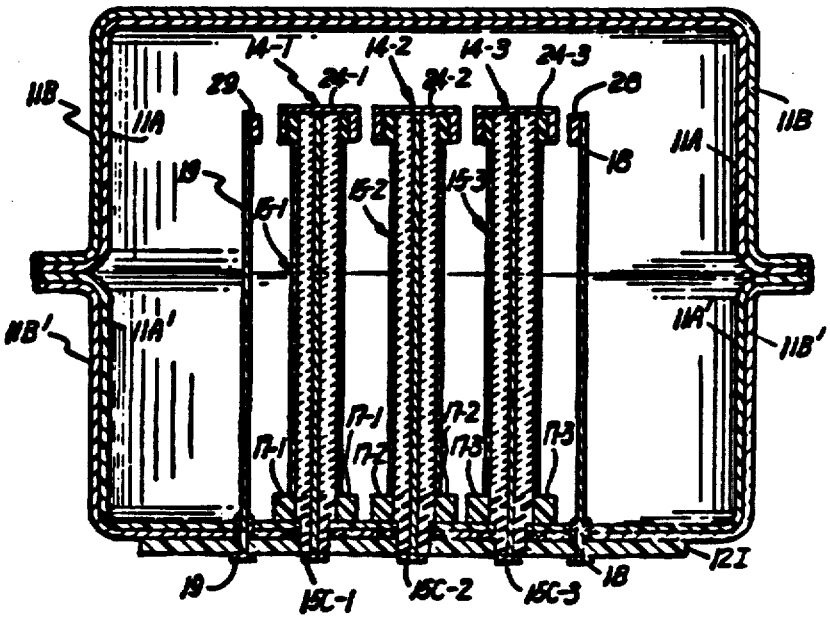

ADVANCED PIEZOCERAMIC POWER SWITCHING DEVICES EMPLOYING PROTECTIVE GASTIGHT ENCLOSURE AND METHOD OF MANUFACTURE

Matter enclosed in heavy brackets [ ] appears in the original patent but forms no part of this reissue specification; matter printed in italics indicates the additions made by reissue.

This application is a division of application Ser. No. 685,108, filed 12/21/84, *now U.S. Pat. No.* 4,714,849.

TECHNICAL FIELD

This invention relates to novel advanced power rated piezoelectric ceramic power switching devices which are mounted within protective gastight enclosures that are either evacuated to a high degree of vacuum or filled with an inert gas protective atmosphere.

More specifically, the invention relates to such advanced piezoceramic power rated switching devices that are capable of operation over a range of voltages extending from a few volts to 5000 volts (5 KV) or more with corresponding currents of from a few amperes to hundreds of amperes, and wherein it is possible to provide a number of such structures in a single common protective gastight enclosure, without interaction.

BACKGROUND PRIOR ART

In the past electromagnetically actuated (EM) relays and switches have been employed for use in higher power rated circuits having power ratings of from a few volts to 5 KV or more and with corresponding current ratings of from 50 amperes to several hundred amperes or greater. These EM relays and switches while satisfactory in many respects are bulky, heavy, slow responding and tend to develop excessive arcing and sparking across the contacts during operation while opening and closing due to their operation in an ambient air atmosphere.

For a number of practical reasons, due to their bulk, weight and out gassing properties, known EM relays and switches can only be operated in air and cannot be enclosed within a protective gastight enclosure that is evacuated. Operation in air enables prolonged arcing which is induced during opening and closing of the contacts of such EM relays and switches. This is due to ionization of the air gaseous medium in the space between the contacts as they open or close so that the operating life of such EM devices in service is severely reduced [and] *which* adds greatly to maintenance problems and expense. Further, EM devices dissipate considerable heat and cannot be upgraded in performance since they are not voltage (capacitor) operated. Lastly, operation of EM device contacts in air induces oxidation of the contact surfaces [and] *which* can greatly increase contact resistance.

Relays and switches which use piezoelectric drive elements have a number of advantages over their electromagnetic (EM) driven counterparts. For example, a piezoelectric driven relay or switch requires substantially lower current and dissipates very little power during operation to open or close a set of load current carrying contacts in comparison to an electromagnetic driven device of the same power rating. Additionally, piezoelectric driven switching devices have very low mass, require less space and introduce less weight into circuit systems with which they are used. Lastly, piezoelectric driven switching devices may have very short actuation times and thus respond much faster than do their EM counterparts. Thus, fast acting switching is possible with smaller and lower weight devices which dissipate less power and generate less heat than does an EM relay or switch of the same power rating.

A number of different piezoelectric ceramic switching devices have been offered for sale in the past having a variety of different configurations. One of the more popular and prevailing structural approaches in these known devices[,] is referred to as a bimorph bender-type piezoelectric ceramic switch device which employs two adjacent piezoelectric plate elements mounted side by side and having conductive electrodes coating their outer surfaces and sharing a common conductive inner surface to form a bimorph bender member. A known commercially available bimorph bender-type piezoceramic switch is described in an application note copy-righted in 1978 *and* published by the Piezo Products Division of Gulton Industries[,] Inc. located in Metuchen, N.J. and Fullerton, Calif. Another such prior art piezoceramic switching device is described in U.S. Pat. No. 2,166,763 issued July 18, 1939 for a "Piezoelectric Apparatus and Circuits". In the intervening years since 1939, piezoceramic bender-type switching devices have been the subject of widely-spread efforts to improve their characteristics. This is evidenced by a relatively large number of patents which have issued in the intervening years such as U.S. Pat. No. 2,714,642 issued Aug. 2, 1955 for a "High Speed Relay of Electromechanical Transducer Material"; U.S. Pat. No. 4,093,883 issued June 6, 1978 for "Piezoelectric Multimorph Switches"; and U.S. Pat. No. 4,403,166 - issued Sept. 6, 1983 for "Piezoelectric Relay with Oppositely Bending Bimorph". Such piezoceramic bender-type switching devices also have been described in a textbook entitled "Manual of Electromechanical Devices" by [Douglass] *Douglas* C. Greenwood, editor, published by McGraw-Hill Book Company and copyrighted in 1965.

Heretofore, piezoelectric ceramic bender-type relays have been described as being employed in a variety of circuits which involve switching of low power rated electrical circuits (i.e., signal level circuits with voltages less than 20 volts and corresponding milliamp range currents). Virtually no commercially available relays have been sold. Also, to date no serious effort has been made to increase the power rating of piezoceramic bender-type relays. A key requirement for a bender actuated relay is the ability of the short gap that forms between the bender-actuated switch contacts as they open (or close) to withstand voltages impressed upon it by the external circuit to which the device is connected. To increase the voltage withstandability of this gap between the contacts after extinction of current flow, it is advantageous to choose an ambient atmosphere such as a vacuum or an inert gas or high dielectric strength atmosphere such as nitrogen and argon or sulfur hexafluoride ($SF_6$), and the like. In such protective vacuum or inert gaseous atmospheres, the gap space between the contacts can attain as high a dielectric as is possible. This is an important consideration regardless of whether the circuit to be switched operates *at* a few volts or 5000 volts since the ability of the contact gap-space to withstand whatever voltage is required after current extinction while the gap spacing is short, translates into a shorter time needed to achieve that gap and consequent higher operating speeds and capability of higher voltage operation.

Relays (which were not piezoelectric in nature) have been operated in a vacuum according to a report in a prior publication entitled "High Voltage Switching with Vacuum Relays" by Ronald V. Tetz and Robert W. Hansen in a paper presented in 1965 at a relay conference conducted by the Institute of Electrical and Electronics Engineers (IEEE). In this publication there is no clear disclosure of the mechanical details of construction of the switch or how it was arranged so that contacts [were] *could be* operated in a vacuum. Further, as of the present date so commercially practical high power vacuum relays have appeared on the market. In addition, at a conference held in 1978 by the IEEE and identified as the Holm Conference, a paper was presented entitled "Electret Driven Electrical Relays" by D. Perino, G. Dreyfus and J. Lewiner-pages 441–446 wherein an electret, not piezoelectric, type relay device *was* operated in a vacuum enclosure [and suitable for use] at signal levels (less than 20 volts) [is] *as* disclosed on page 445. However, electrets due to their nature are hard to bake out during evacuation and further do not hold their charge well so that prolonged usage would not be possible. To the knowledge of the present inventors there has been no previous publication or use of piezoelectric ceramic switching devices mounted and operated within a protective gastight enclosure either in a vacuum or in a protective inert gaseous atmosphere [and suitable] for operation at higher power levels.

SUMMARY OF INVENTION

It is therefore a primary object of this invention to provide novel advanced piezoelectric ceramic power switching devices designed for operation within a vacuum or protective inert gas atmosphere maintained within [the] *a* protective gastight enclosure containing the piezoceramic switching devices, and wherein the piezoceramic switching devices are designed for use with higher power rated circuits ranging from a few volts with a corresponding current rating of 50 or so amperes up to 5 KV or more with corresponding current ratings of several hundred amperes [and also can be] *as well as* operated at low voltages and power in signal level circuits.

Another object of the invention is to provide such advanced piezoceramic power switching devices wherein there are a plurality of such switching devices mounted within a single common protective gastight enclosure.

A further object of the invention is to provide such novel piezoceramic power switching devices which are mounted within a protective gastight enclosure and which employ piezoelectric plate elements that have unpoled portions on which are mounted either passive circuit components such as resistors, capacitors and the like, and/or active semiconductor devices. Such circuit components can be interconnected in circuit relationship with each other and with the switching devices and may be constructed using discrete, printed circuit or integrated circuit fabrication and mounting techniques. As a result, stray circuit impedances which may be either capacitive, inductive or resistive in nature (and which are present in all electrical circuits) can be reduced to an absolute minimum. In certain embodiments of the invention such circuit components and active semiconductor devices are mounted within the common protective gastight enclosure in close proximity to the piezoceramic switching devices to which they are connected.

Still a further object of the invention is to provide such novel piezoceramic power switching devices contained within protective gastight enclosures wherein improved bender properties are provided to the devices [and result in] *for* increased bender force and displacement, [the] optimization of prepolarization and spacing of the bender contacts relative to fixed contacts with which the bender contacts coact and [the] capability of [operation of] *operating* of the switch contacts at higher voltages because of the higher dielectric of the vacuum or protective gaseous atmosphere in which they are mounted. Because of the protective atmosphere and inherent outgassing when the gastight enclosure is evacuated and sealed, no protective conformal coatings or [enscapulation] *encapsulation* of the piezoceramic plate elements comprising the bender is required such as that needed with benders designed for operation in air. It is *also* possible to employ contact materials having lower melting [point materials] *points* for establishment of stable arcs to reduce di/dt at current extinction and which at the same time also have high dielectric strength for improved high voltage withstandability when the contacts open and current ceases to flow at current extinction. Because of the higher dielectric strength achieved while operating [the] *such* improved [material] *contact materials* in a vacuum or protective gas atmosphere, voltage withstandability of the order of 2000 volts per mil can be obtained across properly designed contacts for such devices Further, repeatable and reliable timing of bender-charging, contact closing, bender discharge, contact opening and reverse bender "assist" as desirable or needed, is optimized with the present invention. Since gap dimensions are minimal, bounce and other [detremental] *detrimental* dynamic factors can be better controlled by suitable design.

In practicing the invention a controlled protective atmosphere bender-type piezoelectric ceramic switching device is provided and comprises a gastight protective enclosure secured to a base member for supporting the enclosure and sealing closed the interior of the enclosure in a gastight manner. At least one bender-type piezoelectric ceramic switching device is secured within the gastight protective enclosure and comprises a bender member formed by two juxtaposed prepolarized [peizoelectric] *piezoelectric* ceramic planar plate elements secured together sandwich fashion with each plate element having at least inner and outer conductive surfaces formed on the planar surfaces thereof together with respective terminal means for application of energizing electric operating potentials to the respective plate [element] *elements*. The bender-type piezoelectric ceramic switching device is physically supported on the base member by clamping means secured on opposite sides of the bender member and physically supporting the bender member within the gastight enclosure cantilever fashion with one end thereof freely movable. First movable electric switch contact means are provided within the gastight enclosure for movement by the free movable end of the bender member and coacts with second electrical switch contact means also physically mounted within the gastight enclosure. The second switch contact means are selectively engageable by the first electric switch contact means upon selective application of an energizing electric operating potential to a respective one of the piezoelectric plate elements for causing the bender member to bend and close the first and second electric switch contact means to allow electric load current flow therethrough. Respective electrically conductive load current lead means are connected to respective ones of the first and second electric switch contact means and extend to respective terminal means supported by the base member outside the protective gastight enclosure for selectively supplying electric load current to a load outside the enclosure via the first and second electric switch contact means.

In preferred embodiments of the invention, the portions of the piezoelectric ceramic plate elements clamped under the clamping means are non-poled and both electrically neutral and physically unstrained.

Another feature of the invention is the provision of a plurality of bender-type piezoelectric ceramic switching devices physically mounted within a single common gastight protective enclosure in the manner described above with each such device being separately actuatable for controlling electric load current flow through its coacting switch contacts. In certain embodiments of the invention thus constructed, each bender-type piezoelectric ceramic switching device mounted within the common protective enclosure operates independently of the other switching devices mounted within the same common protective enclosure. In still other embodiments of the invention, a plurality of bender-type piezoelectric ceramic switching devices mounted within a common protective enclosure selectively can be made to coact interdependently with selected other switching devices mounted within the same common protective enclosure.

A further feature of the invention is the provision of novel switching devices constructed in the above-described manner wherein the gastight protective enclosure is permanently evacuated and maintains the piezoceramic switching device or devices mounted therein in a high degree of vacuum throughout the operating life of the devices. In other embodiments of the invention the piezoceramic switching devices mounted within a gastight enclosure are maintained within a protective inert gas atmosphere.

Still a further feature of the invention is the provision of improved switching devices having the above-described characteristics wherein the piezoelectric ceramic planar plate elements of each bender device have unpoled portions which extend beyond the clamping means in a direction away from the prepolarized movable bender portions thereof and which are non-polarized so as to be electrically neutral and physically unstrained. The devices thus constructed further include electric circuit components in the form of passive circuit elements such as resistors, capacitors, and the like and/or active semiconductor devices supported by said unpoled portions of the piezoceramic plate element and electrically connected in circuit relationship with each other and the switching device. This in effect makes it possible to reduce stray circuit impedances of circuits connected to the switching devices to an absolute minimum.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference characters, and wherein:

FIG. 8 is a longitudinal sectional view of still another embodiment of the invention wherein the protective gastight enclosure is comprised by a glass tube secured within a metal mounting sleeve which in turn is secured on a metal base member and wherein the piezoceramic plate elements include unpoled plate portions for mounting and for supporting circuit components outside the protective gastight enclosure;

FIG. 9 is a longitudinal sectional view of still another embodiment of the invention employing a single surrounding protective gastight enclosure fabricated from a plastic material that is overcoated with a conductive surface to provide electromagnetic radiation shielding and wherein a plurality of switching devices are mounted within the gastight enclosure.

BEST MODE OF PRACTICING THE INVENTION

Figure 1:
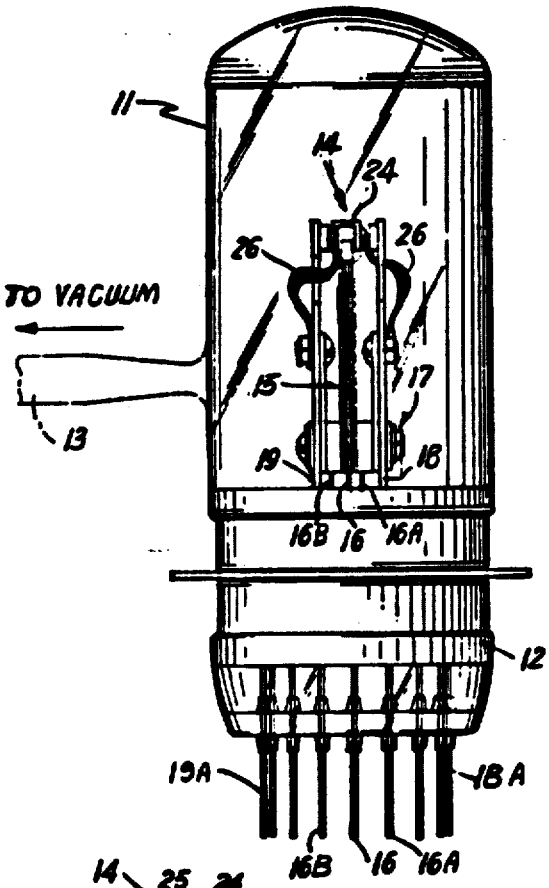
FIG. 1 is a side elevational view of an advanced piezoceramic power switching structure employing a piezoelectric ceramic bender-type switching device mounted [with] *within* an evacuated protective gastight enclosure according to the invention.

FIG. 1 is a side elevational view of a novel advanced piezoceramic power switching device employing a protective gastight enclosure constructed accompanying to the invention. In FIG. 1, a gastight protective glass enclosure is shown at 11 which is in the form of an inverted glass jar having one end supported over a glass base member 12 for supporting the glass enclosure and sealing closed the interior of the enclosure in a gastight manner. A nipple shown at 13 is formed on one side of the glass enclosure 11 for connection to a suitable vacuum pumping device (not shown) for evacuating the interior of the glass enclosure 11 to a high degree of vacuum. The fabrication of the protective glass enclosure 11 and its securement to the base member 12 which preferably is fabricated from glass or an insulating non-outgassing plastic insulating material, is in accordance with known and established electron tube manufacturing techniques as disclosed in such prior publications as the "Handbook of Electron Tube and Vacuum Tube Techniques" by Fred Rosbury published by Addison-Wesley Publishing Company [,] Inc. of Reading, Massachusetts, the textbook entitled "Fundamental of Vacuum Tubes" by Austin B. Eastman, first edition fourth impression published by McGraw-Hill *Book* Company [,] Inc. of New York and London in 1937 and the textbook entitled "Theory and Applications of Electron Tubes" by Herbert J. Reich, second edition second impression published by McGraw-Hill *Book* Company [,] Inc. of New York and London in 1944.

Figure 4:
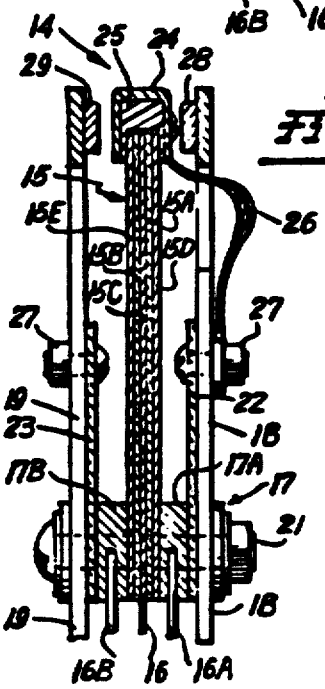
FIG. 4 is a vertical sectional view taken through plane 4—4 of FIG. 3.

At least one bender-type piezoelectric ceramic switching device shown generally at 14 is mounted within the gastight enclosure 11 and is physically supported therein by the base member 12. The bender-type piezoelectric ceramic switching device 14 comprises a bender member 15 which as best shown in FIG. 4 is comprised by two juxtaposed prepolarized planar piezoelectric ceramic plate elements 15A and 15B secured together sandwich fashion to form a unitary structure with each piezoceramic plate element having at least an inner conductive surface 15C which they share in common and outer conductive surfaces 15D and 15E. Respective electric terminal means shown at 16, 16A and 16B are provided for application of energizing electric operating potentials to the inner conductive surface 15C and to each of the outer conductive surfaces 15D and 15E, respectively. The bender-type piezoelectric ceramic switching device 14 is physically mounted cantilever fashion within gastight enclosure 11 on base member 12 by clamping means shown at 17. Clamping means 17 comprise a set of coaching clamping members 17A and 17B which are disposed on opposite sides of bender member 15 with the lower end of the bender member being clamped sandwich fashion between clamping members 17A and 17B with the movable ends thereof extending upwardly in the manner of a cantilever.

The clamping members 17A and 17B are secured to and supported by a set of relatively rigid, upright, spaced apart, conductive contact support members 18 and 19 with the bender member 15 *being* sandwiched therebetween cantilever fashion and the entire structure *being* held together in a relatively rigid manner by through bolts and nuts shown at 21. The clamping members 17A and 17B are formed of electrically conductive material and have terminal leads 16A and 16B secured therein so that they make good electrical contact with and connection to the respective outer conductive surfaces 15D and 15E on piezoceramic plate elements 15A, 15B for application of energizing electric potential to these surfaces. It should be noted that since the piezoelectric ceramic plate elements 15A and 15B are excellent electrical insulators, they provide electrical isolation between the outer conductive surfaces [15B] *15D* and 15E and their respective terminal lead connections provided by the clamping members 17A, 17B and conductive leads 16A, 16B, respectively. The clamping memebrs 17A and 17B are electrically isolated from the conductive contact supporting bars 18 and 19 by insulating surfaces 22 and 23, respectively. For a more detailed description of a preferred form of fabrication and operation including excitation of the bender-type piezoelectric ceramic switching device 14 (to be described more fully hereafter with relation to FIGS. 5 and 6), reference is made to copending U.S. patent application Ser. No. 685,109 in the names of John D. Harnden, Jr. and William P. Kornrumpf for Improved Piezoelectric Ceramic Switching Devices and Systems And Method of Making Same filed concurrently with this application, the disclosure of which hereby is incorporated into the disclosure of this application in its entirety.

Figure 2:
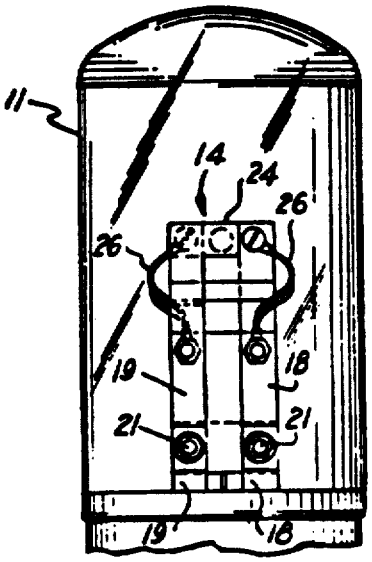
FIG. 2 is a fragmentary front view of the piezoceramic power switching [device] *strucutre* of FIG. 1.
Figure 3:
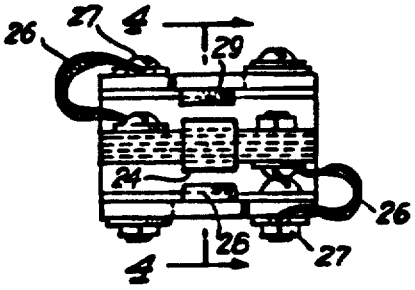
FIG. 3 is an enlarged top plan view of the piezoceramic switching device shown in FIG. 1 removed from the protective gastight enclosure.

As noted in the [preceeding] *preceding* paragraph, the bender member 15 is supported cantilever fashion within the gastight enclosure 11 by clamping means 17 in a manner such that its movable free end is supported and centered within the space defined between the free ends of the upright conductive contact support bars 18 and 19. The movable free end of bender 15 has a first electric switch contact 24 secured thereon in the form *of* an electrically conductive cap that is electrically insulated from the outer conductive surfaces 15D and 15E by an insulating cap member 25 secured to the end of bender member 15 under conductive cap 24. Secured to conductive cap 24 between the cap and the insulating cap 25 is a flexible braided copper belt shown at 26 which runs down to and is secured to the upright conductive support bar 18 about midway *in* its length for providing an electric current path between conductive cap 24 and bar 18. A similar braided conductive belt 26 runs from the left side of the conductive cap 24 to midway the length of upright conductive support bar 19 as shown in FIGS. 1-3 of the drawings, but has not been shown in FIG. 4 in order to simplify the figure. The lower ends of the conductive braided belts 26 are secured to the respective upright conductive support bars 18 and 19 by respective set screw and nut fasteners 27.

To complete the bender-type switching device 14, second electric contact means shown at 28 and 29 are secured to the free ends of the upright, conductive contact support bars 18 and 19, respectively, as best seen in FIG. 4. By this arrangement, it will be seen that when the bender member 15 is caused to bend and close the movable first contact 24 onto contact 29 on conductive bar member 19, a closed, electrically conductive load current path is provided through the upright bar member 19 to the closed contacts 29 and 24 and thence through the flexible braided conductor 26 and back through upright conductive bar member 18 to the load device (not shown) selectively being supplied current through the piezoelectric ceramic switching device 14. Similarly, with the movable contact 24 closed on the fixed contact 28, a closed load current flow path will be established via the closed contacts 24 and 28, via the conductive belt 26 connected to conductive bar member 19 (not shown in FIG. 4) and thence back across the supply current source and load. It will be appreciated therefore that the respective first and second electric switch contact means comprised by movable contact 24 and fixed contacts 28, 29 are provided with respective electrically conductive lead means 26, 18 or 26, 19 extending to respective terminal means comprised by terminal pins [18] *18A* and [19] *19A* supported by the base member outside the protective gastight enclosure 11 for insertion in cooperating sockets (not shown) on a circuit board or other member. Thus, electric load current to a load selectively can be supplied outside the enclosure via the first and second electric switch contacts 24, 28 or 24, 29, respectively. It should be further noted that while in the embodiment of the invention shown in FIGS. 1–4, the lead terminal means includes a flexible conductive belt member 26, it should be understood that the lead means need not necessarily constitute such a flexible conductive belt but could be comprised by conductive runs, jumper conductors or either the inner or outer conductive surfaces such as 15C, 15D or 15E and their corresponding terminal ends 16, 16A, 16B or the like, as described more fully in the above referenced copending U.S. patent application Ser. No. 685,109.

Figure 3A:
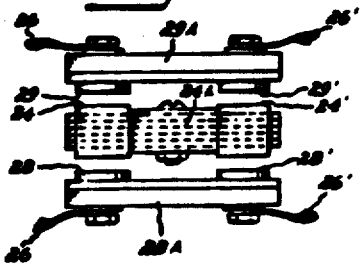

FIG. 3A illustrates a modified version of a power switch contact system usable in the switching device of FIGS. 1–4 in place of that shown in FIG. 3. In FIG. 3A a first set of fixed contacts 28 and 28' are mounted on spaced-apart support posts (not shown, but similar to posts 18 in FIG. 4) located on one side of the movable switch contact system comprised by contacts 24 and 24' secured to the end of bender member 15 and electrically interconnected by an electrically conductive bridging member 24A also secured to the end of bender member 15. A second set of fixed contacts 29, 29' are secured on the opposite side of bender member 15 on posts 19 in confronting relation to movable contacts 24, 24'. Fixed contacts 28 and 28' and 29 and 29' are physically interconnected by insulating bar members 28A and 29A, respectively, and electrically connected to braided conductors 26 and 26' for supply of load current from a load current source (for example) connected through braided conductors 26 to a load (not shown) connected to braided conductors 26'. With this contact structure, current will be supplied to the load via contacts 29, 24, bridging conductor bar 24A and contacts 24', 29' upon the movable bender member closing movable contacts 24 and[,] 24' [and] on fixed contacts 29 and 29'. Upon movement of the bender member in the opposite direction to close movable contacts 24, 24' on fixed contacts 28, 28' current will be supplied to the load via conductive bridging member 28A. Note that in this structure, the movable bender member does not have to carry with it any of the braided conductors 26 *and 26'*.

With the bender-type piezoelectric ceramic switching device constructed as shown and described with relation to FIGS. 1–4 of the drawings and mounted within a gastight evacuated enclosure, it is possible to prepolarize the piezoceramic plate elements 15A and 15B in-situ after fabrication of the device in the manner described above. As disclosed more fully in the above-referenced copending U.S. application Ser. No. 685,109, permanent prepolarization of the movable bender portions of the piezoelectric ceramic plate elements 15A and 15B is accomplished by the application of respective high electric potential to the plates via conductive lead means 16A and 16B, respectively. The high electric prepolarizing potential can be applied while the plates are being maintained at a temperature near and just below their Curie point. This can be accomplished immediately following bakeout of the evacuated gastight enclosure 11 while manufacturing commercial embodiments of bender-type piezoceramic switching devices according to the invention. Commercial embodiments may not include the nipple 13 for continuously evacuating the enclosure 11, 12. The required bakeout and evacuation techniques are described more fully in the above-referenced vacuum tube technology textbooks. In many embodiments of the invention it may be desirable to employ known and established gettering techniques applied after the enclosure has been sealed as explained in the above vacuum tube technology texts. Flash gettering also could be used advantageously. By combining techniques of evacuation and bake-out with gettering, good clean-out of the vacuum-tight enclosures can be achieved less expensively.

Following evacuation and bakeout and while the temperature of the piezoceramic plate elements 15A and 15B is maintained just under the Curie temperature, high value prepolarizing potentials are applied to conductive surfaces [16A] *15D* and [16B] *15E*, respectively, while the common conductive surface 15C and its terminal 16 is held at an opposite polarity potential or substantially at ground potential. It should be noted at this point that because the high value prepolarizing potential is applied to the piezoceramic plate elements 15A and 15B while they are being maintained in a vacuum, and due to the high dielectric value of the vacuum, there is much less susceptibility to breakdown and arcing across the piezoceramic plates during the application of the high value prepolarizing potential. Further higher value prepolarizing potentials can be employed to result in optimized bender operating characteristics such as faster response time and improved contact compressive force as explained hereafter. Room temperature polarizing is also possible since the Curie temperature can be approached in sealing and bake-out with new bender materials that make poling at ambient [termpratures] *temperatures* in situ possible and provides a whole new technique for piezoelectric bender manufacture.

As described more fully in the above-referenced copending U.S. patent application Ser. No. 685,109, prepolarization of the movable bender plates 15A and 15B will leave the plates permanently altered in physical dimensions relative to what they were prior to prepolarization and with a [remnant] *remanent* electric charge. This alteration will be in the form of a permanent increase in physical dimension of the ceramic plate elements 15A and 15B between the poling electrodes 15D-15C [and] *or* 15E–15C and also a permanent decrease in physical dimension parallel to the [electrode] *electrodes* (i.e., along the longitudinal dimensions of the device as shown in FIG. 4). Thereafter, when a voltage of the same polarity but considerably less magnitude than the prepolarizing voltage, subsequently is supplied as an energizing potential between the poling electrodes 15D–15C or 15E–15C, the plate elements 15A or 15B experience a further temporary expansion in the poling direction transverse to the electrodes and contraction parallel to the electrodes. This causes bender member 15 to bend in one direction or the other dependent upon which plate element is energized. When the selectively applied energizing potential is removed, this temporary expansion in the poling direction transverse to the electrodes and temporary contraction parallel to the electrodes is relaxed and the bender member 15 will return to its normal, at rest, unenergized, centered condition. Thus, it will be appreciated that the movable bender member 15 selectively can be made to bend in one direction or the other by application of a suitable energizing potential thereto through dipole enhancement to selectively close either contacts 24–28 or 24–29 and thereafter, upon removal of the energizing potential, automatically will return through internal compressive spring forces to its original prepolarized at rest central position with the contacts [25-28] *24–28* and [25-29] *24–29 remaining* open.

It should be noted at this point in the description that a particularly desirable feature of the invention is the ability to precisely control centering of the bender member 15 with its centrally located movable contact 24 so that the contact 24 is precisely centered relative to the fixe contacts 28 and 29. This is achieved by appropriately adjusting the magnitude of prepolarizing potentials applied in situ across the respective plate elements 15A and 15B during prepolarization thereof as described in the [preceeding] *preceding* paragraph all externally of the sealed protective gastight enclosure. This novel centering [techniques] *technique* makes possible considerable savings in device fabrication costs by combining the prepolarization and centering manufacturing steps into one.

A suitable energization circuit for selectively energizing either piezoceramic plate element 15A or 15B to achieve dipole enhancement of the previously prepolarized bender member in the above briefly described manner is disclosed in FIG. 1B of copending U.S. application Ser. No. 685,109 and reference is made to the description of FIG. 1B for a full disclosure of its construction and operation. The energization circuit has not been shown in the drawings of this application for the sake of simplicity. Briefly, however, it can be stated that the circuit operates to provide selective application of an energizing potential to either of the piezoceramic plate elements 15A or 15B which is of smaller magnitude than the prepolarizing potential, but of the same polarity. This energization potential results in further dipole alignment enhancement that is reflected in a temporary further thickening and shortening of one or the other of the plate elements 15A or 15B. This temporary further thickening and shortening of one of the plate elements consequently [result] *results* in physically bending the free movable end of the active bender member 15 sufficiently to selective close the movable contact 24 on either of the fixed contacts 28 or 29 thereby resulting in establishing load current flow through either of the fixed contacts in the manner described previously above. The load current carrying contacts 24–28 or 24–29 will remain closed for so long as the energizing potential continues to be applied to the respective piezoceramic plate element 15A or 15B being selectively energized. This can be for an indefinite period of time. Thus, the switching device shown in FIGS. 1–4 can be used either as a normally-open or a normally-closed switching device.

The above described characteristics are achieved by reason of three [principle] *principal* features of the switching devices herein disclosed and by appropriate design of the energizing circuit with which they are used. First, the piezoceramic plate elements 15A and 15B essentially are high quality capacitors having little or no losses when electrically charged (energized). Secondary, any losses which do occur over extended periods are supplanted immediately and continously by the continuously applied energizing potential via the energizing circuit. Thirdly, and lastly, because the energizing potential selectively applied to the respective piezoceramic plate elements 15A and 15B always is applied with the same polarity as the prepolarization potential used to initially prepole the piezoelectric ceramic plate elements 15A and 15B, there is no possibility of long term depolarizing effects rendering the device unstable or unpredictable in operation over prolonged periods of operation since the dipole alignment is continuously enhanced.

Upon removal of the selectively applied energizing potential to either of the piezoceramic plate elements 15A or 15B, the active movable bender [portion] *member* 15 returns to its center, neutral, unenergized position thereby opening whichever set of load current carrying contacts 24–28 or 24–29 was closed. It should be noted at this point in the description that prepolarization and subsequent operation with selectively applied energizing potential can be achieved with either a positive polarity or negative polarity potential measured with respect to the outer conductive surfaces [15B] *15D* or [15C] *15E* relative to the central conductive surface 15C.

During its operating life, a power-current switching device spends most of its life with its contacts butted firmly against each other to conduct normal system load current. However, under conditions where it is desired to interrupt load current flow through the switching device, the contacts must be parted. This results in igniting within a gap space formed between the parting contacts of the device an arc discharge that subsequently is extinguished to accomplish interruption or extinction of current flow between the contacts. This phenomenon is explained more fully in a textbook entitled "Vacuum Arcs Theory and Application" by J. M. Lafferty, editor, and published by John Wiley & Sons, New York, N.Y., copyrighted 1980, and in particular in chapter 3 thereof entitled "Arc Ignition Processes" by George A. Farrall, a co-author of the book and one of the co-inventors of this application. On page 81 of this textbook it is stated that two cylindrical metal electrodes (contacts) held with their flat faces one against the other, have actual areas of contact much smaller than the apparent area of the cylindrical ends of the contacts. This is a natural consequence of the fact that the surface of a normally flat electrode (contact) microscopically is very uneven. As the electrodes (contacts) are pushed together, the microscopic projecting regions on the opposing surfaces thereof make initial contact. With added compressive force (called contact compressive force) pushing the contacts together, the initial contact area or areas may be elastically or even plastically deformed, allowing the bulk or the contact surfaces to approach each other a little more closely and permitting other [protuberances] *protuberances* to supplement the initial contact. As a consquence, the total area of contact is made up of a number of microscopically small areas (which vary statistically in size and number) and depend strongly on the compressive force applied to the contacts, their microscopic surface finish, and the elastic/plastic properties of the material from which the contact members are fabricated. These properties widely effect the formation of an arc within the region formed as the contacts part while conducting load current.

For the above stated reasons, one can consider that the actual contact area is made up of several discrete small areas consolidated to form one large circular composite area having an electrical resistance given by $$Rc = \pi/(2a) \quad (I)$$

where $\pi$ is the resistivity of the contact material and a is the composite radius. Because the load current passing from one electrode to the other is funneled through the contacting area, the value of Rc frequently is referred to as constriction resistance or more simply as contact resistance. It has already been stated that the effective microscopic contact area is dependent on contact compressive force, contact surface finish and the elastic/-plastic properties of the contact material. It therefore can be expected that the same parameters directly influence contact resistance Rc. It might also be noted that contact resistance can be influenced by the formation of films such as oxide on the contact surfaces; however, for the particular case of a vacuum enclosure or inert gas protective atmospheres, contact electrodes are usually quite clean so that contact resistance depends principally upon the parameters noted in equation (1) above.

In order to provide illustration of the magnitude of effective contact area that may be realized in a typical EM actuated vacuum interrupter, a 15 KV vacuum interrupter whose contacts were compressed under a load of 50–60 kilograms (KG), was determined to dissipate no more than 14 watts with a normal load current of 600 amperes. About one third of this dissipation was considered to be due to contact resistance. From this it can be inferred to possess a contact resistance of less than 14 micro ohms ($\mu\Omega$) at room temperature. Assuming this value of contact resistance, then the value of a is found to be $6.4\times10^{-4}$ meters with a corresponding contact area of $1.3\times10^{-6}$ squaremeters. This represents less than .1 part in $10^{-3}$ of the apparent contact area of the contact system in question. However, since the constriction resistance region obviously is not at room temperature, the actual contact area realized probably is somewhat larger. The example, however, does show that the actual conducting area joining two closed contacts is very much less than might be guessed by viewing the switching device in question.

It has been determined experimentally that the constriction resistance Rc is found to vary with the power of the compressive load imposed on the contacts by a factor of one half to one third. It is important to note at this point that in addition to all of the desirable characteristics embodied in a piezoelectric ceramic switching device operated within a gastight vacuum enclosure, by reason of the capability of maintaining the excitation voltages supplied to the bender plate elements 15A and 15B continuously after closure of the movable contact 24 on a selected one of the fixed contacts 28 or 29 without depolarizing effects on the piezoelectric ceramic plate elements 15A and 15B, it is possible to continuously maintain the compressive force on the selectively closed switch contacts indefinitely without relaxation to thereby maintain the constriction resistance Rc at a minimum value for indefinite periods of operation. Additionally, because of the larger prepolarization and energizing potentials made possible by operation in a vacuum or inert gas protective atmosphere, the compressive force provided by the bender member can be substantially increased beyond that of a device operated in air.

On page 86 of the above [referened] *referenced* "Vacuum Arcs Theory and Application" textbook there is disclosed a formula $$v_e = \text{constant } K^2/cI \text{ [(2)] } (2)$$

where $V_e$ is the critical velocity of separation of two contact surfaces, K is the thermal conductivity of the contact material, I is the load current flowing through the contacts and c is the heat capacity of the contact system. From this equation it can be shown that for contact electrodes separating while carrying a load current of 100 amperes, the critical velocity for separation of a contact system made from copper is 5 meters per second and for stainless steel is about $10^{-2}$ meters per second. In the above stated example for a 15 KV, 1600 ampere vacuum interrupter, the contact parting speeds are of the order of 1 meter per second as the contacts start to part. In the earlier part of contact separation during formation of an arc created constriction bridge as illustrated and defined on page 83 of the textbook, the parting speed can be lower. The piezoelectric ceramic switching device which is the subject of the instant application can be designed to ideally meet this contact separating and parting speed requirement since it is possible to design into the energization circuit for the device the capability of applying a programmed energization potential both to the selected and to the reverse or opposite piezoceramic plate elements to initially assist and ^cce'erate [in] the initial parting action and after arc formation to provide improved current interruption. The energization to the opposite bender plate element thereafter can be removed within microseconds subsequent to current extinction to avoid going beyond the neutral center position. This important capability also can be of considerable importance in overcoming contact welding effects if and when they occur as described in the above referenced textbook on pages 87–106 thereof.

In an effort to harmonize design of a contact system such as 24–28 or 24–29 with all of the characteristic effects encountered in its operating life, it is essential to provide each contact system with a proper L/D aspect ratio where L is equal to the area (width × length) of the mating contact surfaces and D is equal to the minimum spacing between the microscopically small [projections] *projection* regions that are formed as protuberances on the opposed mating contact surfaces as described in the [preceeding] *preceding* paragraph. It is also desirable to use a low melting point material to reduce di/dt effect at "current chop" (the point where current flow through a contact system is extinguished). It is also desirable that the contact material have a high dielectric for high voltage withstandability when the contacts open. A preferred switch contact system for use with high power switching devices constructed according to the invention employs copper-vanadium alloys [and possesses] *exhibiting* both the desirable characteristics of relatively low melting [point] points and high voltage withstandability after current extinction. For a more detailed disclosure of the copper-vanadium alloy contact system, reference is made to abandoned U.S. application Ser. No. 399,669 entitled "Electrode Contacts For High Current Circuit Interruption" filed July 19, 1982, George A. Farrall, inventor (who is a coinventor of the present invention) and assigned to the General Electric Company.

A particularly advantageous feature of the invention is the ability to increase the voltage withstandability upon the contacts opening by a factor of three or four or more by maintaining a contact system, such as the [coppr] *copper*-vanadium alloy contact system noted above, within a gastight vacuum enclosure or other suitable protective inert gaseous atmosphere. For example, a contact system which has a voltage withstandability of say 30 KV per centimeter in air after opening and extinction of load current flow thereacross, has a comparable voltage withstandability in vacuum of 90–100 KV per centimeter. Thus, it will be appreciated that considerable operating advantages are obtained with the present invention by proper selection of contact materials and [the enclosure of] *by enclosing* the load current carrying contacts and the piezoceramic bender operated switching devices in a protective vacuum gastight enclosure or gastight enclosure filled with *a* protective inert or high dielectric gaseous atmosphere.

Figure 5:
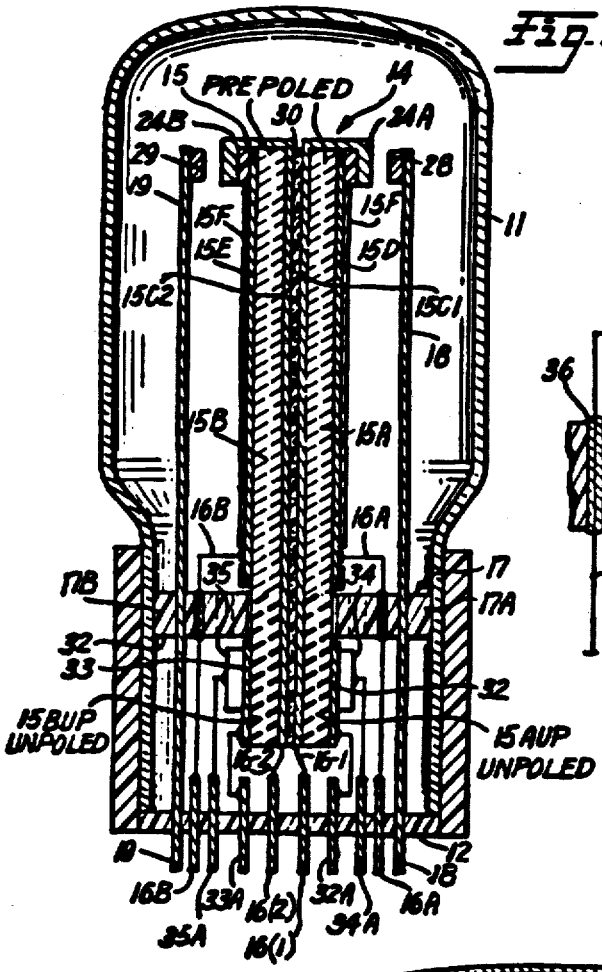
FIG. 5 is a longitudinal sectional view of a preferred embodiment of the invention which provides unpoled portions of the piezoceramic plate elements comprising the bender-type switching device for use in mounting and clamping the bender-type switching device within a protective gastight enclosure and for supporting electrical circuit components thereon in close proximity to the switching device.

FIG. 5 illustrates a different embodiment of the invention wherein similar parts have been given the same reference [numeral] *numerals* applied thereto in the embodiment of the invention shown in FIGS. 1–4. In FIG. 5 a glass envelope is shown at 11 shown seated in a cup-shaped plastic or glass base member 12 to which it is sealed in a gastight manner by suitable adhesive or glass frit seal in the event the cup-shaped base member 12 is made from glass.

The piezoelectric ceramic switching device 14 is supported cantilever fashion within the glass enclosure 11 by a mounting member 17 which is generally circular in configuration and is sealed to the side of the glass enclosure 11 by a glass frit seal (not shown). The clamping [members] *member* 17 described as comprising glass also could be formed from plastic, but must be electrically insulating and de-gassable. The sub-assembly composed of the glass or plastic supporting member 17 and piezoceramic switching device 14 can be assembled initially outside of the glass enclosure 11 by inserting each of the fixed rod supports 18 and 19 for fixed contacts 28 and 29 through suitable openings preformed in clamping member 17 and inserting the bender member 15 in a suitable central opening designed to accomodate it and preformed in the clamping member. The bender member 15 is inserted partially through the central opening of clamping member 17 so that its lower portion extends below clamping member 17 in the manner shown in FIG. 5. After being thus inserted in the member 17, the bender member 15 is secured in member 17 rigidly by means of a glass frit seal shown at 30 in FIG. 6 or by a suitable adhesive having minimal outgassing characteristics.

The piezoelectric ceramic bender member 15 used in the FIG. 5 embodiment of the invention differs from that shown in FIG. 4 in a number of respects. The first and most important is that [that] *a* portion of the piezoceramic plate [element] *elements* 15A and 15B which is sandwiched between the sides of the clamping member 17, as well as a portion suspended below clamping member 17, is not prepoled so that these portions of the plate [element] *elements* identified by reference [numeral] *numerals* 15AUP and 15BUP are unpoled and are electrically neutral and physically unstrained. The portions of the piezoceramic plate elements identified as 15A and 15B which are located above the clamping [members] *member* 17, are prepolarized and hence are electrically charged and physically stressed in the manner described above with relation to FIGS. 1–4.

Figure 6:
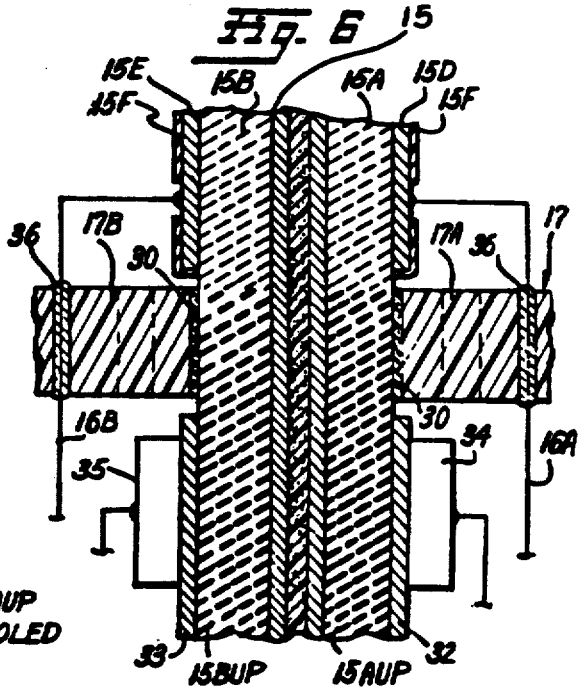
FIG. 6 is an enlarged partial sectional view of the device shown in FIG. 5 illustrating in detail how the bender-type switching device is physically mounted and clamped cantilever fashion within the [portective] *protective* gastight enclosure shown in FIG. 5.

A second significant difference in the fabrication of the bender member 15 shown in FIG. 5 is that two central conductive surfaces identified with the reference characters 15C1 and 15C2 are provided for coacting with the outer conducting surfaces 15D and 15E, respectively, for application of prepolarization and operating energizing potentials to the piezoceramic plate element portions 15A and 15B, respectively. The two plate elements and their adherent conductive surfaces 15C1 and 15C2 are held together in a unitary structure by a central adhesive layer 30 which may be either insulating in nature or conductive in nature dependent upon design criteria and intended usage. If the central adhesive layer is insulating in nature, than a gap is provided between the two halves of the upper surface of the conductive cap 24 to provide separate, electrically isolated movable contact surfaces 24A and 24B on the movable end of bender member 15. Suitable prepolarizing electric potentials and operating energizing potentials are applied to the respective outer conductive surfaces [15A] *15D* and [15B] *15E* via jumper conductors 16A and 16B and thin surface-mounted terminals pads identified by the same reference numerals as the jumper conductors to which they are connected. In a similar manner, jumper conductors identified as 16(1) and 16(2) are provided from the inner conductive surfaces 15C1 and 15C2 to the corresponding numbered terminal pins for application of operating energizing potential and to provide a suitable conductive path for load current flow upon closure of either of the movable contact halves 24A or 24B on their respective fixed contacts 28 or 29. As best seen in FIG. 6 of the drawings, the jumper conductors 16A and 16B where they pass through the glass or plastic clamping [members] *member* 17 are provided with suitable openings through which they are sealed firmly closed by a glass frit seal or suitable adhesive as shown at 36 in FIG. 6. This same arrangement is provided where the terminal pins for each of the conductive leads passes through the bottom of the base member 12, but in order to simplify the drawings, such sealed passageways have not been illustrated in detail.

A third important feature of the present invention is made possible by the unpoled portions 15 AUP and 15BUP of the piezoceramic plate [element] *elements* which [extends] *extend* below the clamping member 17. Suitable conductive surfaces identified as 32 and 33 are formed on these unpoled portions of the piezoceramic plate elements so as to form at least one capacitor in conjunction with the central conductive surfaces 15C1 or 15C2 within the unpoled region of the piezoceramic plate elements. If desired, more than one capacitor can be fabricated in this manner by suitably dividing up the outer conductive surfaces 32 or 33 or both into the desired number of capacitors. In addition, either discrete, printed circuit or hybrid integrated circuit resistors or other circuit components shown at 34 and [25] *35* including miniaturized semiconductor active devices are mounted over the conductive surfaces 32 and 33 or directly onto the unpoled portions of the piezoceramic plate elements. Such circuit components are connected in circuit relationship via printed conductors (not shown) or jumper connector wires and terminal pins 32A, 33A, 34A and 35A as desired for a particular circuit configuration in a manner described more fully in the copending U.S. application Ser. No. 685,109 referenced above. By fabrication of the piezoelectric ceramic switching devices in this manner to provide predetermined unpoled portions of the plate elements for use as suitable insulating backing members upon which discrete, hybrid, or monolithic integrated circuit devices can be formed, it is possible to reduce stray circuit impedances whether inductive, capacitive or resistive in nature to an absolute minimum thereby assuring reliable excitation and operation of the piezoceramic switching devices.

For those devices which are intended for use in a protective atmosphere of an inert gas such as nitrogen, argon, helium or a high dielectric gas such as $SF_6$ or the like, it may be desirable to provide an outer conformal coating of a protective material shown at 15F over the prepolarized portions of bender member 15. By the provision of such a protective coating, the possibility of breakdown either during prepolarization or during subsequent operation, is further reduced. A suitable coating material for this purpose which would not unduly damp the movement of the bender member 15 in operation is polyimide siloxane copolymer which provides an excellent pinhole free surface passivating protective coating and which also can be used as an adhesive during bender lamination, for example to secure the two bender plate elements together as shown in FIG. 5. Other adhesive materials which could take the high temperature bakeout required for use in vacuum devices without undue outgassing include GEMID(imide ether) or ULTEM [(polyethermide)] *(polyetherimide)*.

The combination of selective bender member poling as shown in FIG. 5 together with always energizing the switch with an energizing potential having the same polarity as the prepolarizing potential assures continued reliable operation of the switch in service. Further, if required for a particular device, the protective surface coating 15F is applied to completely encompass all of the active movable areas of the bender member 15 but is not subjected to the sharp bending action that takes place at the clamped portion of the piezoelectric plate elements. As a result, greater reliability, stability and longevity in operation and voltage withstand capability is achieved.

After fabrication of the piezoelectric ceramic switching device 14 in the above described manner and mounting of the device on the clamping member 17, the switching device and clamping member sub-assembly is inserted into the protective gastight envelope 11. This assemblage is then slipped down into the cup-shaped base member 12 to which the outer surface of the enclosure 11 then is sealed either by a glass frit seal if base member 12 is made of glass, or, alternatively, a suitable adhesive such as those listed above. At this point, the interior of the gastight enclosure is evacuated if it is designed to operate as a vacuum device, or alternatively it is filled with an inert protective gas such as those noted above, in a manner known to those skilled in the art of electron tube manufacture. To assure equalization of the atmosphere within the enclosure 11, through passageways are formed in clamping member 17 as shown by dotted lines at 17A and 17B and are located in an evenly distributed manner around the periphery of clamping member 17.

Figure 7:
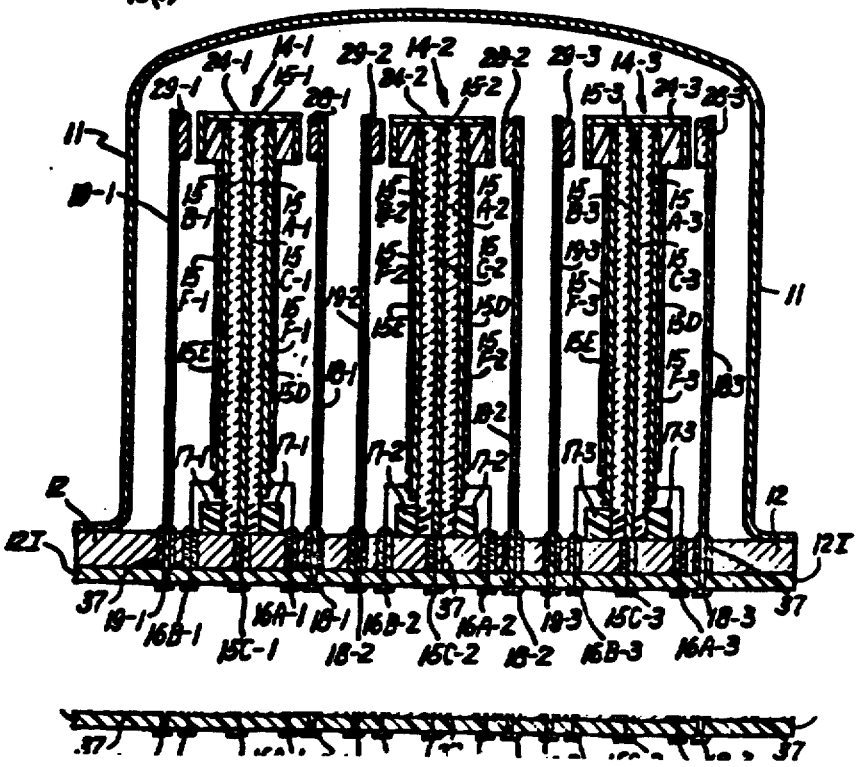
FIG. 7 is a longitudinal sectional view of still a different embodiment of the invention mounted within an all metal protective gastight enclosure and provided with surface mounted device terminals for ease of installation and wherein there are a plurality of piezoceramic bender-type switching devices mounted within a single common protective gastight enclosure.

FIG. 7 is a vertical sectional view of an embodiment of the invention wherein there are a plurality of piezoelectric ceramic switching devices 14-1, 14-2 and 14-3 mounted within a single, gastight protective enclosure 11. In this embodiment of the invention the gastight enclosure member 11 is fabricated from a conductive metal which is spot welded, resistance welded, one-shot welded or cold welded to the base member 12 in a manner such that the piezoelectric ceramic switching devices are not exposed to any heat while sealing the enclosure member 11 on to the base member 12 to form the required gastight seal. The individual bender members 15-1, 15-2 and 15-3 are constructed quite similar to the bender device shown in FIGS. 1-4 in that each employs a single central conductive surface [15C] *15C-1, 15C-2, or 25C-3* that is common to the respective piezoelectric ceramic plate elements of each bender device. The individual bender members 15-1, 15-2 and 15-3 have the lower ends thereof individually clamped to the top surface of the base member 12 by respective sets of insulating clamping bars 17-1, 17-2 and 17-3 which are secured to the base members and to the bottom ends of the bender members [15] *15-1, 15-2 and 15-3* either by set screws (not shown) or an adhesive or both so as to firmly clamp the lower ends of the bender plate elements together in a unitary structure that is secured to base member 12. In this embodiment of the invention the portions of the piezoceramic plate elements of each bender member which are disposed between the clamping members 17-1, 17-2 and 17-3, respectively, have no outer conductive surfaces and are not prepoled. Consequently, the clamped portions of the respective piezoceramic plate elements of the bender members are electrically neutral and mechanically unstressed. Prepolarizing and operating energizing potentials are applied to the outer conductive surfaces 15D and 15E formed on the outer sides of the respective upper prepoled bender member piezoelectric plate elements 15A-1, 15B-1[:] ; 15A-2, 15B-2 and 15A-3, 15B-3. This is done by means of jumper connector wires that have one end connected to the lower end of the outer conductive surfaces of each bender member and which extend through openings in the metal base member 12 (such openings being sealed either by glass frit *37* or a suitable adhesive) and through an underlying insulating layer 12I and then [terminate] *terminated* in small conductive pads identified as 16A-1, 16B-1; 16A-2, 16B-2 and 16A-3, 16B-3. The conductive pads constitute surface mounted device terminal pads which have relatively flat surfaces and are designed to fit over mating conductive pads formed on a circuit board or other chassis member, and over which they are superimposed and then permanently mated by spot or resistance welding, conductive adhesive or other suitable conductive bonding techniques. For a more detailed description of surface mounted devices and their fabrication, reference is made to an article entitled "Surface Mounting Alters the PC-Board Scene" appearing in "Electronics"-Feb. 9, 1984 issue, pages 113-124. Similarly, the contact support members [18] *18-1, 18-2, 18-3* and [19] *19-1, 19-24, 19-3* for the fixed contacts of each piezoceramic switching device 14-1, 14-2 and 14-3 likewise extend through openings in the conductive base member 12 and its underlying insulating surface 12I and terminate in surface device mounted pads for providing electrical connection to each of the fixed contacts 28-1, 29-1; 28-2, 29-2 and 28-3, 29-3 of the piezoceramic switching devices.

In addition to the above noted structural characteristics, each of the bender members 15-1, 15-2 and 15-3 have their outer conductive surfaces which cover the prepolarized movable plate element portions of the bender provided with a conformal protective coating 15F-1, 15F-2 amd 15F-3 such as polyimide siloxane copolymer which provides an excellent pinhole free surface passiving protective coating for each of the respective piezoceramic bender-type switching devices. The conformal protective coatings are not provided, however, if a device fabricated as shown in FIG. 7 is to be operated in a vacuum environment since the vacuum operated devices do not require the additional protection provided by the conformal protective coating. However, if the device is to be filled with an inert gas atmosphere, then it may be desirable to provide the protective conformal coatings to the respective bender members.

During fabrication of the multiple switching device embodiment shown in FIG. 7, each of the respective piezoceramic bender-type switching devices 14-1, 14-2 and 14-3 initially are mounted to the base member 12 and appropriate interconnection conductive paths, jumper connectors and surface mounted device terminal pad connections are provided thereto through the lower insulating surface 12I as described above to form a complete sub-assembly that then is inserted into the inverted bowl-shaped conductive cover member 11. At this point, the cover member 12 is spot welded, resistance welded, cold welded or adhesively secured to the upper peripheral surface of the conductive base member 12 making sure not to raise the temperature of the interior to excessive values that could be injurious to the physical characteristics of the piezoceramic plate elements. The interior of the resulting gastight protective enclosure 11 then either is evacuated to a high degree of vacuum ranging from $10^{-10}$ [Torrs] *Torr* down to $10^{-6}$ [Torrs] *Torr*, or, alternatively, filled with an inert gas atmosphere in a manner known in the electron tube manufacturing art. Thereafter, the device may be raised in temperature to a value just below the Curie temperature of the piezoelectric ceramic plate elements and a high prepolarizing potential applied to the outer conductive surfaces of each of the bender members while a reverse polarity or ground potential is applied to the central conductive surfaces of each switching device 14-1, 14-2 and 14-3 in the manner described earlier. During this prepolarization treatment, it is desirable to separately and appropriately adjust the prepolarizing potential across each piezoelectric ceramic plate element so that the bender [member 15] *members 15-1, 15-2 and 15-3* formed thereby [is] *are* precisely centered between each of [its] *the respective* coacting fixed contacts 28 and 29 as depicted in the drawings. By thus initally aligning the respective bender members [15] in a desired central position during prepolarization, further individual adjustments to properly align the respective bender members after completion of manufacture of the overall assembly is not required. During alignment, optical and capacitive means can be used to [guage] *gauge* equivalent spacing which otherwise is most difficult if not impossible to obtain using conventional positioning techniques. A multiple piezoceramic switching device such as shown *in* FIG. 7 wherein three individual bender-type switches are provided in a single, common gastight enclosure protective environment is ideally suited for use in controlling current flow through *a* multi-phase circuit arrangement, such as three phase AC system, since there is an individual piezoceramic bender-type switching device provided for use in connection with each phase of the three phase circuit.

FIG. 8 illustrates still another embodiment of the invention wherein a two part gastight enclosure is provided. The two part enclosure of FIG. 8 is comprised by an upper inverted glass jar member 11A having an open lower end that is designed to seat in and be sealed to a lower metallic sleeve member 11B that in turn sits on and is welded or otherwise secured to a metallic base member 12 by spot or resistance welding, etc. A piezoelectric ceramic switching device 14 is mounted within the gastight enclosure 11A, 11B, 12 and is constructed in a manner similar to the piezoceramic switching device 14 employed in the embodiment of the invention shown in FIG. 5 and FIG. 6. Accordingly, like parts in each of the figures have been given identical reference characters and will not be described further except to point out differences in construction and mounting.

In the FIG. 8 embodiment, the piezoelectric ceramic plate elements 15A and 15B include both an upper prepolarized movable bender portion and a lower unpoled portion 15AUP and 15BUP with the upper part of the unpoled portions of the plate [element] *elements* being clamped between insulating clamping [members] *member* 17 that are disposed in a central opening in the base member 12 and secured thereto by a suitable glass frit seal, adhesive or other similar sealant. Below the clamped portion of the unpoled sections of the piezoceramic elements, there are formed suitable capacitors by the conductive surfaces 32 and 33 coacting with opposed sections of the central conductive surfaces 15C-1 or 15C-2, respectively, in the interposed portions of unpoled ceramic 15AUP and 15BUP. Mounted over the capacitors thus formed are circuit components 34 and 35, respectively, which may comprise passive circuit elements such as discrete, [hybride] *hybrid* or monolithic integrated resistors, conductors, fuses and the like and/or active semiconductor devices interconnected in circuit relationship by suitable printed conductor paths. The circuits thus comprised may be part of the energizing circuit for the prepolarized bender plate elements 15A or 15B or may comprise part of the circuit element interconnected with the load current switch contacts 24A, 28 or 24B, 29, or both. It should be noted that in this embodiment of the invention, the complementary circuit elements formed on the unpoled positions 15AUP and 15BUP of the piezoceramic plate elements extend below the base member 12 and are not included within the protective atmosphere within enclosure 11A, 11B and base member 12.

In the FIG. 8 embodiment of the invention, as in the FIG. 5 version, the central conductive surfaces 15C-1 and 15C-2 can be and are in a number *of* embodiments of the invention electrically isolated from each other through the use of an insulating adhesive 30 to secure the two bender plate elements 15A and 15B together in a unitary structure. By thus fabricating the bender plate elements, it is possible to reduce the inter-capacitor coupling that otherwise occurs between capacitor elements 32 and 33 if only a single central conductive surface is employed. In this manner, it is possible to better isolate the circuits comprised by capacitor elements 32 and 33 together with other circuit components such as resistors 34 and 35 and/or other circuit components so that two circuits fabricated from such components can operate substantially independently of each other.

During manufacture of the improved piezoceramic switching device with protective gastight enclosure as shown in FIG. 8, the piezoceramic switching device 14 first is fabricated in this manner previously described in copending U.S. application Ser. No. 685,109 and then mounted on the base member 12 in the manner shown. Here again, the fixed contact support members 18 and 19 pass through openings in base member 12 and are suitably sealed by a glass frit seal or a suitable adhesive such as those noted eariler in the specification. At this point in the manufacture, or prior thereto, the glass enclosure 11A will have been sealed to the metallic sleeve member 11B by a suitable glass frit seal shown at 41. The combined enclosure 11A, 11B then is seated over [tne] *the* base member 12 and the piezoceramic switching device 14 [subassembly] *sub-assembly* and the rim portion of the lower metallic member 11B is welded to the periphery of the base member 12 by spot welding, resistance welding, cold welding or the like in a procedure which does not allow the interior [of the] enclosure temperature to rise to an excessive value that could be damaging to the piezoceramic bender elements nor exceed any Curie temperature.

The interior of the enclosure 11A, 11B, 12 then is evacuated to a high degree of vacuum of the order of $10^{-10}$ to $10^{-6}$ [Torrs] *Torr* and sealed closed in a manner known to those skilled in the art of vacuum tube technology. Following evacuation, the temperature of the device may be elevated to a level just below the Curie temperature of the piezoceramic bender plate elements 15A and 15B and a prepolarization potential applied across the conductive surfaces 15D, 15C-1 and across 15E, 15C-2 to prepolarize the bender plate elements in a manner previously described. Again, as in other embodiments of the invention during prepolarization, proper centering of the bender member 15 between the fixed contacts 28 and 29 is achieved by manipulation of the respective prepolarization potentials applied in the above described manner. For convenience and in order to simplify the drawings, the required interconnecting leads and terminals to provide prepolarization and excitation potentials to the bender plate elements and the circuit components 32-35 have not been illustrated but would correspond substantially to the [elements as] *configurations* shown in the FIG. 5 embodiment of the invention.

FIG. 9 illustrates another embodiment of the invention wherein a plurality of individual piezoceramic bender-type switching devices 14-1, 14-2 and 14-3 are mounted within a protective gastight enclosure formed by [two] *mated* half bowl-shaped members 11A, 11B and 11A', 11B'. In this multiple device embodiment of the invention, however, in contrast to the embodiment shown in FIG. 7, only a single pair of fixed contacts 28 and 29 together with their supporting members 18 and 19 are required instead of the three separate sets of such fixed contacts employed in the embodiment of the invention shown in FIG. 7. Because of this structural feature, it is possible to so program the excitation voltages applied to the respective bender member 15-1, 15-2 and 15-3 so that the switching devices can be caused to operate interdependently with each other. For example, in one operating mode, bender member 15-1 can be caused to close its movable contact 24-1 on fixed contact 29 and thereafter in sequence, bender member 15-2 closes its movable contact 24-2 on movable contact 24-1 followed by actuation of bender member 15-3 to close its movable contact 24-3 on movable contact 24-2 of bender member 15-2. When thus programmed, it will be appreciated that closed electrical branch circuits are provided through fixed contact 29 and its support member 19 via movable contact 24 and the central conductive surface 15C-1 of bender member 15-1, through movable contact 24-2 and the central conductive surface 15C-2 and through movable contact 24-3 and the central conductive surface 15C-3 of bender member 15-3. In another operating mode, all three bender members 15-1, 15-2 and 15-3 can be caused to close their respective movable contacts 24-1, 24-2 and 24-3 in circuit relationship on the fixed contact 28. Alternatively, each of the bender members 15-1, 15-2 and 15-3 can be selectively excited in a manner to close their movable contacts on each other either separately, in pairs, or all three together independently of the fixed contacts 28 and 29 to form two different two branch circuit closures or a three branch circuit closure. Thus, it will be appreciated that considerable flexibility in switching operations is provided by a multiple switch device structure constructed as shown in FIG. 9.

The FIG. 9 embodiment of the invention differs further from the embodiment shown in FIG. 7 in the nature of the gastight enclosure formed by the [two] *mated* separate half bowl-shaped members 11A, 11B and 11A', 11B'. Each half is comprised by a first layer 11A formed of a proprietary plastic of the General Electric Company sold under the trademark ULTEM and is fabricated from [polyethermide] *polyetherimide* material. A characteristic of this material is that it can be readily and inexpensively coated with a conducting surface 11B, *11B'* either before or after molding into desired shapes such as the half bowl-shaped enclosures 11A, 11B and 11A', 11B' depicted in FIG. 9. The lower half bowl-shaped member 11A', 11B' includes an insulating base member 121 secured over the conductive surface 11B' through which insulating openings are provided for conductive leads 18, 19, 15C-1, 15C-2 and 15C-3 that are connected to surface mounted device pads formed on the lower outer surface of the insulating base [members] *member* 12I. The additional leads and terminal pads needed to supply prepolarization and excitation potentials to the outer conductive surfaces of the respective piezoceramic bender members 15-1; 15-2 and 15-3 have not been illustrated for the sake of simplicity and not to unduly complicate the drawing. Such interconnections would be similar to those shown and described with relation to FIG. 7.

Each of the piezoceramic bender members 15-1, 15-2 and 15-3 are mounted within the gastight enclosure comprised by the two half bowl-shaped members 11A, 11B and 11A', 11B' by clamping means 17-1, 17-2 and 17-3 comprised by insulating bar members that are secured by set screws or adhesives or both, across the respective bender members 15-1, 15-2 and 15-3 to hold them together as unitary structures and to secure each bender member to the insulating surface 11A' again either by set screws, adhesives or other similar bonding devices or agents. After securement of the bender members in this manner to the lower enclosure bowl half along with the fixed contact rod supports 18 and 19, the lower half bowl member assembly including the bender-type switching devices is mated with the upper half bowl member 11A, 11B and the two bonded together around their [runs] *peripheral edges* with a suitable adhesive to form a gastight enclosure. The enclosure because of the conductive surfaces 11B, 11B' also prevents emission of undesired electromagnetic interference waves (E.M.I.) produced by the load current carrying switch contacts during switching.

With the gastight protective enclosures 11A, 11B and 11A', 11B' sealed closed, the entire enclosure is evacuated to a high degree of vacuum or filled with a protective inert gas. Thereafter, the temperature within the enclosure may be raised to a level just under the Curie temperature of the piezoelectric ceramic plate elements and a high voltage prepolarizing potential applied across the plate elements in the previously described manner to thereby prepolarize the bender plate elements. Again, as in other embodiments, during prepolarization the prepolarizing potential values are adjusted to precisely center the bender members 15-1, 15-2 and 15-3 in the spaces allowed both with respect to each other and with respect to the gap spacing between the movable contacts of the end bender members 24-1, *24-2* and 24-3 and the fixed contacts 28 and 29.

The FIG. 9 embodiment of the invention is of particular value in illustrating the virtues of a form H contact system made available by the invention wherein a normally centrally disposed, unenergized bender member is precisely centered in its electrically neutral or off condition to provide one mode of operation and then selectively can be moved either to the right or to the left to provide two additional modes of operation. The form H contact system is provided in this embodiment of the invention but still alows one to excite the piezoelectric plate elements in their prepoled direction without applying reverse voltages on the opposite piezoelectric plate element of the bender members. Thus, a type H system is provided with a neutral centered off position and natural (in phase with the prepoling direction) energization to provide flexure in two opposite directions without the possibility of depoling [of] the bender [member] *members* over prolonged periods of operation due to the need for application of reverse polarity fields across one or the other piezoceramic plate elements of the bender members. Further, because of mounting the bender members in gastight protective enclosures which are either evacuated to a high degree of vacuum ranging from $10^{-10}$ [Torrs] *Torr* to $10^{-6}$ [Torrs] *Torr*, or, alternatively, filling the gastight enclosure with an inert protective gas such as nitrogen or argon or a high dielectric gas such as sulfur hexaflouride ($SF_6$), considerably higher voltages may be used both in the prepoling operation and in subsequent energization operations to provide much faster switching response and *increased* compressive forces on the contacts during closure.

Additional features of the form H switching system provided by the switching structures shown in all of the figures of the application, are the elimination of the possibility of simultaneous operation of two loads due to logic errors, transients or contact welding, etc. This is in contrast to the electromagnetic relay art where it is very difficult to balance the mechanical restoring forces on the relay armature to provide a stable center-off position as provided in the devices made available by the present invention. As illustrated and described with relation to FIG. 9, additional switching modes are available with such structures that cannot be achieved with traditional electromagnetic actuated switches and relays. In FIG. 9, depending upon the bender excitation and number of individual stages provided, different external loads selectively can be energized. Control of polyphase circuits in an obvious application for the multi-device switches mounted within a single protective enclosure together with all of their attendant advantages whereby one can provide separate control over each phase closure time independently of the closure time required for other phases. Further, systems employing the invention can include synchronization of switch closing or opening (or both) to line voltage or current zeros or assisted communication modes and makes available amazingly high performance devices for use in high duty cycle applications.

Figure 10:
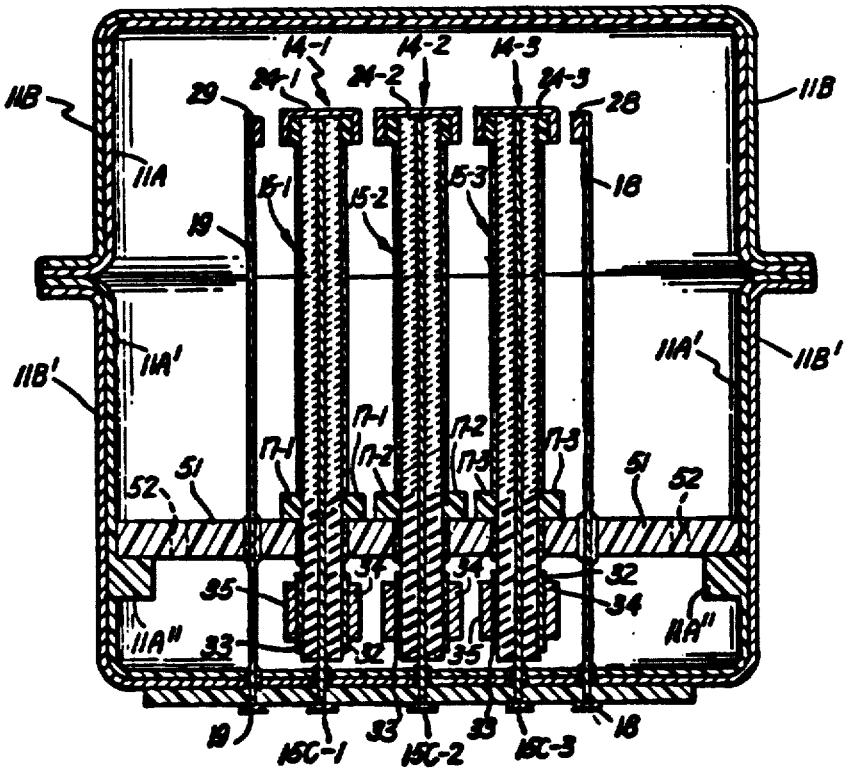
FIG. 10 is a longitudinal sectional view of still another embodiment of the invention similar to that of FIG. 9 but wherein unpoled portions of the piezoceramic plate [element] *elements* are provided for use in clamping and mounting the bender-type switching devices cantilever fashion within the enclosure and also providing mounting surfaces on which circuit elements comprising the switching circuit with which the switching devices are used are all mounted within a single common gastight enclosure and there are a plurality of switching devices within the same protective gastight enclosure.

FIG. 10 illustrates a modification to the embodiment of the invention shown in FIG. 9 to provide for the inclusion of unpoled portions of the piezoelectric ceramic plate elements (together with circuit components mounted thereon) within the protective gastight enclosure 11A, 11B and 11A', 11B'. In this modification of the invention, the inner insulating ULTEM surface 11A' of the lower half bowl member 11A', 11B' of the housing is provided with a circumferential shoulder 11A'' upon which is seated and secured an insulating plastic or glass support member 51 through which are formed a number of through passages indicated by dotted lines at 52 for maintaining the atmosphere (or evacuated spaces) on each side of the member 51 equalized. The support member 51 has secured thereon the respective bender members 15-1, 15-2 and 15-3 by means of their respective sets of clamping members 17-1, 17-2 and 17-3. These portions of the piezoelectric ceramic plate elements comprising respective bender members 15-1, 15-2 and 15-3 which are disposed between the clamping members and also those portions which extend below the support member 51, are unpoled so that they are both electrically neutral and mechanically unstressed. On these unpoled portions of the piezoceramic plate members, respective circuit components such as capacitors, resistors, and other passive [and] *and/or* active circuit components such as semiconductor devices are formed as shown at 32, 33, 34 and 35 in the same manner described with relation to the embodiment of the invention shown in FIG. 5. In other respects, the embodiment of the invention shown in FIG. 10 is similar to the FIG. 9 species, is fabricated in a similar manner and operates in the same fashion. In FIG. 10, as was done with other embodiments of the invention, all of the required interconnected jumper conductors, printed conductor paths, or other connections to the bender [plae] *plate* elements, circuit components and surface mounted device terminal pads have not been illustrated in order to simplify the drawing.

From the foregoing description, it will be appreciated that the invention makes available novel piezoceramic power switching devices contained within protective gastight enclosures wherein improved bender properties are provided to the devices. These improved properties result in increased bender force and translate into increased contact compressive force for the switching contacts which the benders actuate, improved bender displacement, optimization of prepolarization voltages to achieve optimum spacing of the bender contacts relative to the fixed contacts and the capability of operation of the switch contacts at higher voltages because of the higher dielectric *characteristics* of a vacuum or protective gas atmosphere in which the device are mounted. Because of these characteristics and the protective atmosphere provided by the gastight enclosure, plural switching devices can be mounted in a single common enclosure and the need for conformal coatings or [encapaulation] *encapsulation* of the prepolarized portion of the piezoceramic plate elements is obviated. Further, it is possible to employ contact materials such as copper-vanadium alloys having low melting points for establishment of stable arcs to reduce di/dt at current chop (current extinction) during switching and high voltage withstandability. This is made possible since the protective atmosphere in which the contacts are used provides higher voltage withstandability upon contact opening and at current extinction [and maintain] *while maintaining* the contacts is a non-oxidizing atmosphere such as a vacuum to protect the low melting point contacts and prevent changes in their contact resistance. Because of the higher dielectric strength and other characteristics noted above *which are* achieved while operating in a vacuum or protective gas atmosphere, voltage withstandability of at least 2000 volts per mil [are] *is* obtainable with such devices. Further, repeatability timing of bender charging, contact closing, bender discharging, contact opening and reverse bender assist, as needed, is optimized.

INDUSTRIAL APPLICABILITY

The invention makes available a family of novel [advance] advanced piezoelectric ceramic power switching devices which are mounted within protective gastight enclosures that can be either evacuated to a high degree of vacuum of the order of $10^{-10}$ to $10^{-6}$ [Torrs] *Torr* or filled with an inert protective gas atmosphere such as nitrogen, argon, $SF_6$ or the like. The switching devices thus fabricated can be used over a wide power range for both industrial, commercial and residential applications.

Having described several embodiments of advanced piezoceramic power switching structures employing protective gastight enclosures and constructed in accordance with the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A controlled atmosphere bender-type piezoelectric ceramic electrical switching device comprising a gastight protective enclosure [secure] *secured* to a base member for supporting the enclosure and sealing closed the interior of the enclosure in a gastight manner, at least one bender-type piezoelectric ceramic switching device having a bender member formed by two juxtaposed selectively prepolarized piezoelectric ceramic planar plate elements secured together sandwich fashion with each plate element having at least inner and outer conductive surfaces formed on the planar surfaces thereof together with respective terminal means for selective application of energizing electric operating potentials to the prepolarized portions of the respective plate elements, said bender-type piezoelectric ceramic switching device being physically supported on said base member within said enclosure by clamping means secured on opposite sides of the bender member at non-prepolarized portions of the respective plate elements and physically supporting the bender member cantilever fashion with only the prepolarized portions thereof being freely movable whereas the non-prepolarized portions of said piezoelectric ceramic plate elements clamped under said clamping means remain both electrically neutral and physically unstrained, first electric switch contact means within said gastight enclosure moved by the free movable end of said bender member, second electric switch contact means physically mounted within said gastight enclosure and selectively engageable by the first electric switch contact means upon the selective application of an energizing electric operating potential to a respective one of the piezoelectric plate elements for causing the bender member to bend and close the first and second electric switch contact means to allow electric current flow therethrough, and respective electrically conductive lead means connected to a respective one of said first and second electric switch contact means and extending to respective terminal means supported by said base member outside said protective gastight enclosure for selectively supplying electric load current to a load outside said enclosure via said first and second electric switch contact means, wherein the non-prepolarized piezoelectric ceramic planar plate element portions extend beyond the clamping means in a direction away from the prepolarized movable member portions, and wherein the device further includes electric circuit components in the form of passive circuit elements and/or active semiconductor devices supported by said non-prepolarized portions of said piezoelectric ceramic plate elements and electrically connected in circuit relationship with said switching device.

2. A controlled atmosphere bender-type piezoelectric ceramic electrical switching device comprising a gastight protective enclosure secured to a base member for supporting the enclosure and sealing closed the interior of the enclosure in a gastight manner, at least one bender-type piezoelectric ceramic switching device having a bender member formed by two juxtaposed selectively prepolarized piezoelectric ceramic planar plate elements secured together sandwich fashion with each plate element having at least inner and outer conductive surfaces formed on the planar surfaces thereof together with respective terminal means for selective application of energizing electric operating potentials to the prepolarized portions of the respective plate elements, said bender-type piezoelectric ceramic switching device being physically supported on said base member within said enclosure by clamping means secured on opposite sides of the bender member at non-prepolarized portions of the respective plate elements and physically supporting the bender member cantilever fashion with only the prepolarized portions thereof being freely movable whereas the non-prepolarized portions of said piezoelectric ceramic plate elements clamped under said clamping means remain both electrically neutral and physically unstrained, first electric switch contact means within said gastight enclosure moved by the freely movable end of said bender member, second electric switch contact means physically mounted within said gastight enclosure and selectively engageable by the first electric switch contact means upon the selective application of an energizing electric operating potential to a respective one of the piezoelectric plate elements for causing the bender member to bend and close the first and second electric switch contact means to allow electric current flow therethrough, and respective electrically conductive lead means connected to a respective one of said first and second electric switch contact means and extending to respective terminal means supported by said base member outside said protective gastight enclosure for selectively supplying electric load current to a load outside said enclosure via said first and second electric switch contact means, wherein the non-prepolarized piezoelectric ceramic planar plate element portions extend beyond the clamping means in a direction away from the prepolarized movable bender portions and carry switch energization circuit means which selectively applies a source of bender energization potential to the prepolarized movable bender portion of each plate element having the same polarity as the polarity of the prepoled electric field previously permanently induced in said prepolarized movable bender portions so that no depolarization of the plate elements occurs during successive operation of the piezoelectric ceramic bender-type switching device.

3. A controlled atmosphere bender-type piezoelectric ceramic electrical switching device as in claim 2 wherein said switch energization [circuits] *circuit* means includes electric circuit components in the form of passive circuit elements and/or active semiconductor devices.

4. A controlled atmosphere bender-type piezoelectric ceramic electrical switching device as in claim 2 wherein there are a plurality of bender-type piezoelectric ceramic switching devices physically mounted within a single common gastight protective enclosure with each such device being separately actuable for controlling load current flow therethrough.

*5. A controlled atmosphere bender-type piezoelectric ceramic electrical switching structure comprising*

*(a) a gastight protective enclosure secured to a base member for supporting the enclosure and sealing closed the interior of the enclosure in a gastight manner,*

*(b) at least one bender-type piezoelectric ceramic switching device having a bender member formed by two juxtaposed piezoelectric ceramic planar plate elements secured together sandwich fashion with at least a selected plate element having inner and outer conductive surfaces formed on the planar surfaces thereof, together with terminal means for application of energizing electric operating potentials to the selected plate element,*

*(c) means connected to the terminal means for providing energizing electric operating potentials having a single selected polarity,*

*(d) the bender-type piezoelectric ceramic switching device being physically supported on the base member within the enclosure by clamping means secured on opposite sides of the bender member and physically supporting the bender member cantilever fashion with one end thereof being freely movable,*

*(e) first electric switch contact means within the gastight enclosure moved by the freely movable end of the bender member,*

*(f) second electric switch contact means within the gastight enclosure and selectively engageable by the first electric switch contact means upon the selective application of the energizing electric operating potential to the selective plate element for causing the bender member to bend and close the first and second electric switch contact means to allow electric current to flow therethrough, and*

*(g) respective electrically conductive lead means connected to the first and second electric switch contact means and extending to respective terminal means supported by the base member outside the protective gastight enclosure for selectively supplying electric load current to a load outside the enclosure via the first and second electric switch contact means.*

*6. The switching structure of claim 5 wherein there are a plurality of bender-type piezoelectric ceramic switching devices physically mounted within a single common gastight protective enclosure, with each such device being actuable for controlling electric load current flow therethrough.*

*7. The switching structure of claim 6 wherein each bender-type piezoelectric ceramic switching device mounted within the common protective enclosure includes its own coacting first and second electric switch contact means and operates independently of the other switching devices mounted within the common protective enclosure.*

*8. The switching structure of claim 6 wherein the bender-type piezoelectric ceramic switching devices mounted within the common protective enclosure can be made to coact interdependently with selected other switching devices mounted within the same common protective enclosure.*

*9. The switching structure of claim 5 wherein the gastight protective enclosure is permanently evacuated and maintains the bender-type piezoelectric ceramic device in a high degree of vacuum throughout is operating life.*

*10. The switching structure of claim 5 wherein the gastight protective enclosure is filled with an inert or high dielectric gas atmosphere.*

*11. The switching structure of claim 5 wherein the piezoelectric ceramic planar plate elements have unpoled portions which extend beyond the clamping means so as to remain electrically neutral and physically unstrained.*

*12. The switching structure of claim 11 wherein the device further includes circuit components in the form of passive circuit elements and/or active semiconductor devices physically supported by the unpoled portions of the piezoelectric ceramic plate elements and are electrically connected in circuit relationship with the switching device.*

*13. The switching structure of claim 12 wherein the unpoled portions of the piezoelectric ceramic plate elements and any electric circuit components supported thereby are physically located within the gastight protective enclosure.*

*14. The switching structure of claim 11 wherein there are a plurality of bender-type piezoelectric ceramic switching devices physically mounted within a single common gastight protective enclosure with each such device being separately actuable for controlling load current flow therethrough.*

*15. The switching structure of claim 11 wherein there are a plurality of bender-type piezoelectric ceramic switching devices physically mounted within a single common gastight protective enclosure and wherein at least one of the bender-type piezoelectric ceramic switching devices can be made to coact interdependently with selected other bender-type piezoelectric ceramic switching devices mounted within the same common protective enclosure.*

*16. The switching structure of claim 11 wherein the unpoled portions of the piezoelectric ceramic plate elements and any electric circuit components supported thereby are physically located within the gastight protective enclosure.*

*17. The switching structure of claim 11 wherein the gastight protective enclosure is permanently evacuated and maintains the bender-type piezoelectric ceramic device in a high degree of vacuum throughout its operating life.*

*18. The switching structure of claim 11 wherein the gastight protective enclosure is filled with an inert or high dielectric gas atmosphere.*

*19. A controlled atmosphere bender-type piezoelectric ceramic switching structure comprising*

*(a) a gastight protective enclosure secured to a base member for supporting the enclosure and sealing closed the interior of the enclosure in a gastight manner,*

*(b) at least one bender-type piezoelectric ceramic switching device having a bender member formed by two juxtaposed piezoelectric ceramic planar plate elements secured together sandwich fashion with each plate element having inner and outer conductive surfaces formed on the planar surfaces thereof, together with respective terminal means for application of energizing electric operating potentials to the respective plate elements,*

*(c) means connected to the terminal means for providing energizing electric operating potentials to each of the*

*plate elements, the energizing operation potential applied to each plate having a single selected polarity,*

*(d) the bender-type piezoelectric ceramic switching device being physically supported on the base member within the enclosure by clamping means secured on opposite sides of the bender member and physically supporting the bender member cantilever fashion with a movable end,*

*(e) respective first electric switch contact means on the outer surfaces of each of the plate elements, the first switch contact means being within the gastight enclosure and moved by the movable end of the bender member,*

*(f) second electric switch contact means opposite the respective first switch contact means on each of the plate elements, the second switch contact means being within the gastight enclosure and selectively engageable by the opposing first electric switch contact means upon the selective application of an energizing electric operating potential to one of the piezoelectric plate elements for causing the bender member to bend and close the selected first and second electric switch contact means to allow electric current to flow therethrough and*

*(g) respective electrically conductive lead means connected to respective ones of the first and second electric switch contact means and extending to respective load terminal means supported by the base member outside the protective gastight enclosure for selectively supplying load current from a power source to a load outside the enclosure via the first and second electric switch contact means.*

*20. The switching structure of claim 19 wherein there are a plurality of bender-type piezoelectric ceramic switching devices physically mounted within a single common gastight protective enclosure with each such device being actuable for controlling electric current flow therethrough.*

*21. The switching structure of claim 20 wherein each bender-type piezoelectric ceramic switching device mounted within the common protective enclosure includes its own coacting first and second electric switch contact means and operates independently of the other switching devices mounted within the common enclosure.*

*22. The switching structure of claim 20 wherein the bender-type piezoelectric ceramic switching devices mounted within the common protective enclosure can be made to coact interdependently with selected other switching devices mounted within the same common protective enclosure.*

*23. The switching structure of claim 19 wherein the gastight protective enclosure is permanently evacuated and maintains the piezoelectric ceramic switching device in a high degree of vacuum throughout its operating life.*

*24. The switching structure of claim 19 wherein the gastight protective enclosure is filled with an inert or high dielectric gas atmosphere.*

*25. Electrical switching apparatus comprising:*

*a gastight protective enclosure secured to a base member for supporting the enclosure,*

*means for sealing the interior of the enclosure in a gastight manner,*

*at least one piezoelectric bender member having*

*a bender portion formed by two juxtaposed piezoelectric planar plate elements secured together sandwich fashion, the bender portion having inner and outer conductive surfaces formed on the planar surfaces of the plate elements, and*

*a non-bending portion adjacent the bender portion, the non-bending portion being electrically isolated from the conductive surfaces,*

*first terminal means operatively connected to the conductive surfaces for applying electric potentials to the respective plate elements in the bender portion,*

*means for clamping the bender member within the enclosure by securing the non-bending portion so that the bender member is physically supported cantilever fashion with the bender portion being movable, the non-bending portion being clamped by the clamping means,*

*first electric switch contact means within the gastight enclosure mechanically connected to the movable end of the bender portion,*

*second electric switch contact means physically mounted within the gastight enclosure and selectively engageable by the first electric switch contact menas upon the selective application of an electric potential to a respective one of the piezoelectric plate elements for causing the bender member to bend and close the first and second electric switch contact means to allow electric current flow therethrough,*

*respective electrically conductive lead means connected to the first and second electric switch contact means and extending to respective second terminal means supported by the base member outside the protective gastight enclosure for selectively supplying electric load current to a load outside the enclosure via the first and second electric switch contact means, and*

*electric circuit components in the form of passive circuit elements and/or active semiconductor devices supported to said non-bending portion of the bender member and electrically connected in circuit relationship with the first terminal means.*

*26. Electrically switching apparatus comprising*

*a gastight protective enclosure secured to a base member for supporting the enclosure,*

*means for sealing the interior of the enclosure in a gastight manner,*

*at least one piezoelectric bender member having*

*a bender portion formed by two juxtaposed piezoelectric planar plate elements secured together sandwich fashion, the bender portion having inner and outer conductive surfaces formed on the planar surfaces of each plate element, and*

*a non-bending portion adjacent the bender portion, the non-bending portion being electrically isolated from the conductive surfaces,*

*first terminal means operatively connected to the conductive surfaces for applying electric potentials to the respective plate elements in the bender portion,*

*means for clamping the bender member within the enclosure by securing the non-bending portion so that the bender member is physically supported cantilever fashion with the bender portion being movable,*

*first electric switch contact means within the gastight enclosure mechanically connected to the movable end of the bender portion,*

*second electric switch contact means physically mounted within the gastight enclosure and selectively engageable by the first electric switch contact means upon the selective application of an electric operating potential to a respective one of the piezoelectric plate elements for causing the bender member to bend and close the first and second electric switch contact means to allow electric current flow therethrough,*

*respective electrically conductive lead means connected to the first and second electric switch contact means and extending to respective second terminal means supported by the base member outside the protective gastight enclosure for selectively supplying electric load current to a load outside the enclosure via the first and second electric switch contact means, and*

*switch energization circuit means on the non-bending portion for applying bender energization potential to a selected plate element in the bender portion, the bender energization potential having a selected direct current polarity so that no depolarization of the plate elements occurs during successive operations of the bender member.*

*27. The apparatus of claim 26 wherein the switch energization circuit means comprises electric circuit components in the form of passive circuit elements and/or active semiconductor devices.*

*28. The apparatus of claim 26 comprising a plurality of bender members physically mounted within a single common gastight protective enclosure, with each bender member being separately actuable for controlling load current flow therethrough.*

* * * * *